United States Patent
Petry

(10) Patent No.: US 11,092,981 B2
(45) Date of Patent: Aug. 17, 2021

(54) CONTROL GAIN AUTOMATION

(71) Applicant: Siemens Schweiz AG, Zurich (CH)

(72) Inventor: Karl-Heinz Petry, Reichenburg (CH)

(73) Assignee: SIEMENS SCHWEIZ AG, Zurich (CH)

( * ) Notice: Subject to any disclaimer, the term of this patent is extended or adjusted under 35 U.S.C. 154(b) by 157 days.

(21) Appl. No.: 16/031,310

(22) Filed: Jul. 10, 2018

(65) Prior Publication Data

US 2019/0018432 A1    Jan. 17, 2019

(30) Foreign Application Priority Data

Jul. 11, 2017  (EP) .................................... 17180633

(51) Int. Cl.
  *F24F 11/84*      (2018.01)
  *F25B 41/20*      (2021.01)
    (Continued)

(52) U.S. Cl.
  CPC ......... *G05D 7/0635* (2013.01); *F16K 31/046* (2013.01); *F24D 19/1015* (2013.01); *F24F 11/84* (2018.01); *F25B 40/00* (2013.01); *F25B 41/20* (2021.01); *G05B 13/02* (2013.01); *G05B 23/0235* (2013.01); *G05D 7/00* (2013.01); *H03M 3/458* (2013.01); *F16K 1/221* (2013.01); *H03M 1/12* (2013.01)

(58) Field of Classification Search
  USPC ........................................................ 700/282
  See application file for complete search history.

(56) References Cited

U.S. PATENT DOCUMENTS

| | | | |
|---|---|---|---|
| 5,705,734 A | * | 1/1998 | Ahmed ................ F24F 11/0001 73/1.35 |
| 6,962,164 B2 | | 11/2005 | Lull et al. ......................... 137/2 |

(Continued)

FOREIGN PATENT DOCUMENTS

| | | |
|---|---|---|
| CN | 1514960 A | 7/2004 |
| CN | 105229349 A | 1/2016 |

(Continued)

OTHER PUBLICATIONS

Machine Translation of JP-6257855-A (Year: 1994).*

(Continued)

*Primary Examiner* — Jennifer L Norton
(74) *Attorney, Agent, or Firm* — Slayden Grubert Beard PLLC

(57) ABSTRACT

A valve assembly may include: a valve body with a fluid path extending between the inlet port and the outlet port; a valve member with a closed position blocking the fluid path and an open position; a sensor the fluid flow; an actuator coupled to the valve member; and a controller for the actuator with a set point value and a default flow rate indicative of nominal flow through the fluid path. The controller may: read the sensor; calculate a flow rate; compare the flow rate to a threshold value indicative of substantially zero flow rate; and if the measure of flow rate is below the threshold value, calculate a position of the valve member directly from the set point value and the default flow rate, produce a control signal from the calculated position, and communicate the control signal to the actuator.

15 Claims, 1 Drawing Sheet

(51) Int. Cl.
*G05B 13/02* (2006.01)
*G05B 23/02* (2006.01)
*G05D 7/00* (2006.01)
*G05D 7/06* (2006.01)
*F16K 31/04* (2006.01)
*F24D 19/10* (2006.01)
*F25B 40/00* (2006.01)
*H03M 3/00* (2006.01)
*F16K 1/22* (2006.01)
*H03M 1/12* (2006.01)

(56) References Cited

U.S. PATENT DOCUMENTS

| | | | | |
|---|---|---|---|---|
| 8,352,087 | B2* | 1/2013 | Yli-Koski | G05D 7/0635 700/13 |
| 9,658,628 | B2 | 5/2017 | Burt | |
| 10,378,443 | B2* | 8/2019 | Clark | F01D 17/105 |
| 2002/0060226 | A1* | 5/2002 | Kameyama | B67D 1/0858 222/1 |
| 2005/0115612 | A1* | 6/2005 | Tanaka | G05D 7/0635 137/486 |
| 2005/0223813 | A1* | 10/2005 | Lull | G01F 1/86 73/861 |
| 2006/0036404 | A1* | 2/2006 | Wiklund | G01F 1/363 702/183 |
| 2009/0125154 | A1* | 5/2009 | Yli-Koski | G05D 7/0635 700/282 |
| 2010/0133258 | A1* | 6/2010 | Fima | F17D 5/02 219/482 |
| 2010/0147394 | A1* | 6/2010 | Trnka | F24D 19/1015 137/12 |
| 2011/0162742 | A1* | 7/2011 | Ulens | F24D 19/1024 137/624.27 |
| 2011/0264281 | A1* | 10/2011 | Smirnov | G05D 7/0635 700/282 |
| 2013/0153041 | A1* | 6/2013 | Kucera | F23N 1/005 137/14 |
| 2013/0153042 | A1* | 6/2013 | Young | F23N 1/005 137/14 |
| 2014/0053912 | A1* | 2/2014 | Gregor | G05D 16/2006 137/12 |
| 2014/0067135 | A1 | 3/2014 | Lehnert et al. | 700/276 |
| 2014/0290262 | A1* | 10/2014 | Holcomb | F02C 9/32 60/772 |
| 2015/0005955 | A1* | 1/2015 | Gregor | G05D 7/0664 700/282 |
| 2015/0176931 | A1* | 6/2015 | Aeberhard | F28F 27/00 165/200 |
| 2016/0139609 | A1* | 5/2016 | Smirnov | F16K 37/0091 137/551 |
| 2016/0353614 | A1 | 12/2016 | Yokohata et al. | 700/282 |
| 2017/0045255 | A1* | 2/2017 | Karamanos | G05D 7/0635 |
| 2017/0285668 | A1* | 10/2017 | Moseley | E21B 43/26 |
| 2018/0113446 | A1* | 4/2018 | Anderson | G05D 16/20 |
| 2018/0238577 | A1* | 8/2018 | Drees | F24F 11/58 |
| 2019/0249897 | A1* | 8/2019 | Alcala Perez | F24F 11/62 |
| 2020/0011721 | A1* | 1/2020 | Romer | G01F 15/063 |

FOREIGN PATENT DOCUMENTS

| | | | | |
|---|---|---|---|---|
| CN | 109229265 | A | | 1/2019 |
| EP | 1025403 | B1 | | 1/2006 ............ F25G 49/02 |
| EP | 2434187 | A1 | * | 3/2012 ............ F16K 31/025 |
| EP | 3115703 | A1 | | 1/2017 ............ F24D 19/10 |
| FR | 3052528 | A1 | * | 12/2017 ........... F16K 31/084 |
| JP | 06257855 | A | * | 9/1994 ............ B05D 7/24 |
| JP | 0996440 | A | | 4/1997 |
| JP | 09096440 | A | * | 4/1997 ............ G06F 1/206 |
| WO | WO-2015019128 | A1 | * | 2/2015 ............ B05D 7/24 |
| WO | WO-2015031327 | A1 | * | 3/2015 ............ G06F 1/206 |
| WO | WO-2017039683 | A1 | * | 3/2017 ............ G06F 1/206 |
| WO | WO-2017218148 | A1 | * | 12/2017 ........... F16K 31/084 |

OTHER PUBLICATIONS

Human Translation of JP-09096440-A (Year: 1997).*
Machine Translation of EP-2434187-A1 (Year: 2012).*
Faurecia Systemes D'Echappement; Patent Application Titled "Hybrid Dosing Unit", Mar. 7, 2014 in Energy Weekly News; NewsRx, Atlanta, pp. 842-848. (Inventor: Lacouture) (Year: 2014).*
Patents; Patent Application Titled "Flow-Control Valve System and Method", Mar. 19, 2015 in Patent Application Approval Process, Politics & Government Week, NewsRx, Atlanta, pp. 1382-1385. (Inventor: Schick et al.) (Year: 2015).*
Chinese Office Action, Application No. 201810751898.4, 11 pages.

* cited by examiner

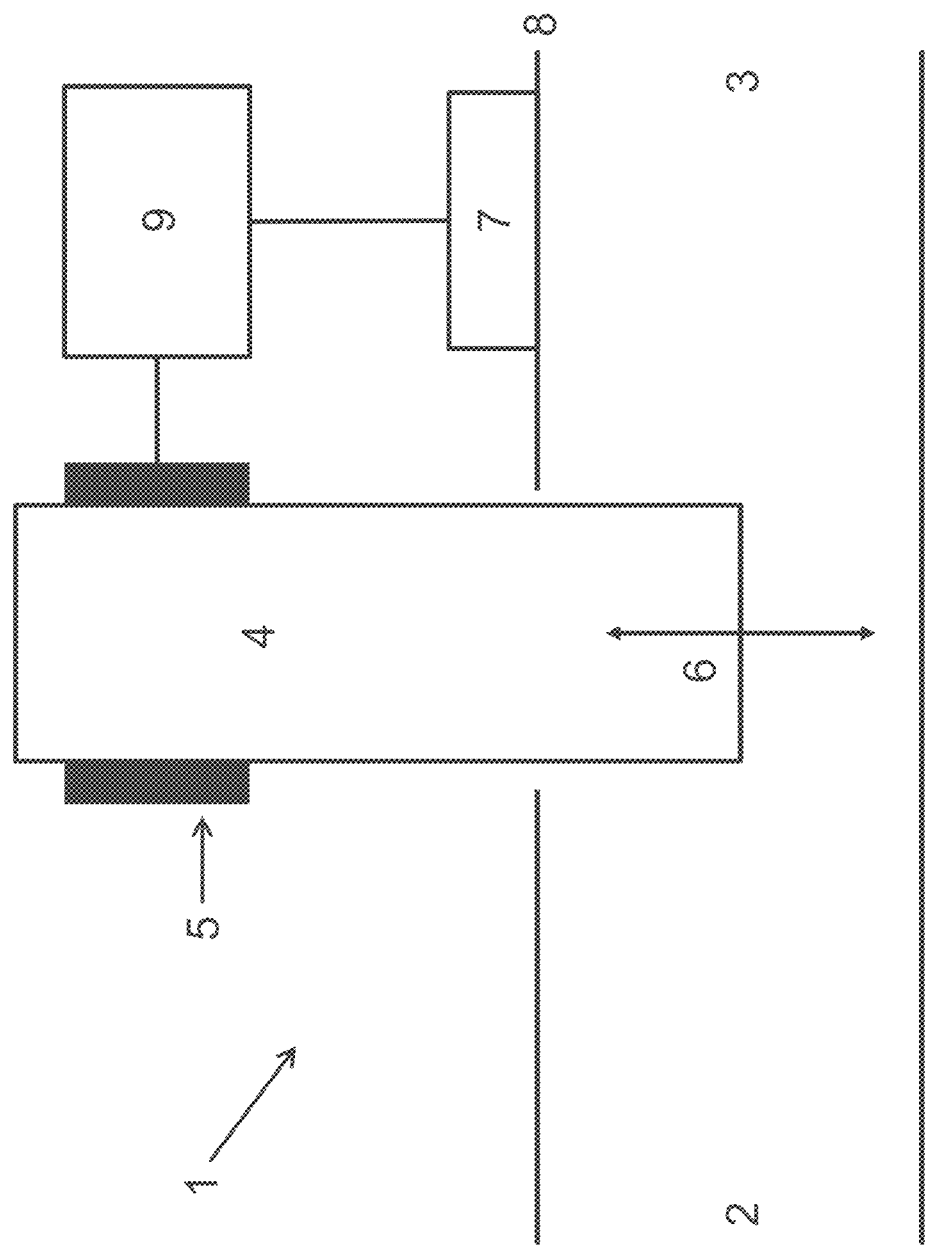

CONTROL GAIN AUTOMATION

CROSS-REFERENCE TO RELATED APPLICATIONS

This application claims priority to EP Application No. 17180633.4 filed Jul. 11, 2017, the contents of which are hereby incorporated by reference in their entirety.

TECHNICAL FIELD

The present disclosure relates to valves. Various embodiments of the teachings herein may include self-adapting control for valves, e.g., in an installation for heating, ventilation, and/or air-conditioning (HVAC).

BACKGROUND

A HVAC installation for a structure typically comprises a number of heat exchangers. These heat exchangers supply heating and/or cooling for the various spaces of the structure. To adjust amounts of heating and/or cooling supplied to a space, a heat exchanger can be fitted with a valve that regulates the capacity for heating and/or cooling. Regulation of capacity for heating and/or cooling is generally effected by a valve element of the valve arranged in a fluid path through the heat exchanger. The position of the valve element is determined via valve travel, thereby enabling and/or to restricting fluid flow through the heat exchanger. Sophisticated arrangements employ closed-loop control to match actual temperatures inside spaces of a structure to set-points.

A common control algorithm for closed-loop control of valve travel involves proportional, integral and/or derivative (PID) control. Individual parameters for proportional, integral and/or derivative control are employed by such a controller. In order to tailor a PID controller to its specific environment, its proportional, integral and/or derivative parameters need be tuned. Proper tuning of these parameters is known to be an arduous task. To obviate the issue of proper tuning, self-adapting controllers provide functionality to determine and/or to guess sets of proportional, integral and/or derivative parameters. The patent application EP1025403A1, an adaptive control for a refrigeration system using pulse width modulated duty cycle scroll compressor, was filed on 9 Sep. 1998. EP1025403A1 was published on 9 Aug. 2000.

EP1025403A1 discloses self-adapting control of flow through a compressor. The self-adapting algorithm determines fluctuations in an error signal. A set of fuzzy input values is then generated from these values. Application of predetermined rules to these fuzzy inputs yields a fuzzy output value. Finally, the controller defuzzyfies the output value to produce a new (proportional) gain factor.

Self-adapting control algorithms may take advantage of opening curves. Opening curves determine flow through a valve as a (direct) function of pressure drop and valve travel h. A characteristic function f(h) maps valve stroke to flow such that flow is a (direct) linear function of f. That is, a value of f(h)=0 indicates no flow through a value. Likewise, f(h)=1 indicates a valve is in its fully open position.

SUMMARY

The teachings of the instant disclosure may be embodied in valve controllers with self-adapting algorithms. Various embodiments may include a generic control algorithm that is applicable to a wide range of fluid conveyors. For example, some embodiments may include a valve assembly for controlling a fluid flow to an appliance comprising: a valve body having an inlet port (2) and an outlet port (3), with a fluid path extending between the inlet port (2) and the outlet port (3); a valve member (4) situated in the fluid path between the inlet port (2) and the outlet port (3), the valve member (4) selectively displaceable between a closed position, which closes the fluid path between the inlet port (2) and the outlet port (3), and an open position, which opens the fluid path between the inlet port (2) and the outlet port (3); a sensor(7) for sensing one or more parameters related to a fluid flow through the fluid path; an actuator (5) coupled to the valve member (4); and a controller (9) for controlling the position of the valve member (4) via the actuator (5) in accordance with a set point value and with a default flow rate indicative of nominal flow through the fluid path. The controller (9) may be communicatively coupled to the actuator (5) and to the sensor (7) and configured to: read one or more signals from the sensor (7), process the one or more signals to a measure of flow rate, compare the measure of flow rate to a predetermined threshold value indicative of zero flow rate or of substantially zero flow rate through the fluid path, and, if the measure of flow rate is less than or equal to the predetermined threshold value, calculate a position of the valve member (4) directly from the set point value and the default flow rate, produce a control signal from the calculated position, and communicate the control signal to the actuator (5).

In some embodiments, the valve assembly additionally comprises a valve conduit (8) enveloping the fluid path between the inlet (2) and the outlet (3), wherein the sensor (7) comprises a flow sensor and is affixed to the valve conduit (8) and is arranged outside the fluid path.

In some embodiments, the controller (9) comprises a memory and the memory stores at least one of the set point value, the predetermined threshold value, and/or the default flow rate indicative of nominal flow through the fluid path.

In some embodiments, the controller (9) comprises an output interface with a predetermined communication bus protocol and is communicatively coupled to the actuator (5) via the output interface and is configured to communicate the control signal to the actuator (5) via the output interface using the predetermined communication bus protocol of the output interface.

In some embodiments, the controller (9) is configured to calculate a ratio between the set point value and the default flow rate, and calculate the position of the valve member (4) directly from the calculated ratio.

In some embodiments, the controller (9) comprises a microprocessor, wherein the microprocessor comprises an analog-to-digital converter as an integral component of the microprocessor, wherein the controller (9) is communicatively coupled to the sensor (7) via the analog-to-digital converter, and wherein the controller (9) is configured to process the one or more signals to a measure of flow rate using the analog-to-digital converter.

In some embodiments, the analog-to-digital converter is configured to carry out delta-sigma modulation and the controller (9) is configured to process the one or more signals to a measure of flow rate using the analog-to-digital converter and using delta-sigma modulation.

In some embodiments, the controller (9) is configured to compare the measure of flow rate to a predetermined threshold value indicative of zero flow rate or of substantially zero flow rate through the fluid path, and, if the measure of flow rate is above the predetermined threshold value, calculate a position of the valve member (4) from the set point value and from the measure of flow rate, produce a control signal from the calculated position, and communicate the control signal to the actuator (5).

In some embodiments, the controller (9) is configured to calculate a position of the valve member (4) directly from the set point value and the measure of flow rate and a previous position of the valve member (4), produce a control signal from the calculated position, and communicate the control signal to the actuator (5).

In some embodiments, the controller (9) is configured to calculate a ratio between the set point value and the measure of flow rate and calculate the position of the valve member (4) directly from the calculated ratio and the previous position of the valve member (4).

In some embodiments, the controller (9) comprises a memory (for) storing the previous position of the valve member (4) and is configured to read the previous position of the valve member (4) from its memory.

In some embodiments, the controller (9) comprises a memory for storing at least a calculated position of the valve member (4) and is configured to write the calculated position of the valve member (4) to the memory.

In some embodiments, the controller (9) comprises a memory for storing at least a calculated position of the valve member (4) and is configured to produce a control signal from the calculated position using proportional and/or integral and/or derivative control.

In some embodiments, the controller (9) comprises a memory storing a lookup table and is configured to read the lookup table from its memory, preferably from its non-volatile memory, and produce a control signal from the calculated position using a lookup table.

In some embodiments, the controller (9) comprises an input interface with a predetermined communication bus protocol and is communicatively coupled to the sensor (7) via the input interface and is configured to read one or more signals from the sensor (7) via the input interface using the predetermined communication bus protocol of the input interface.

BRIEF DESCRIPTION OF THE DRAWINGS

Various features will become apparent to those skilled in the art from the following detailed description of the disclosed non-limiting embodiments. The drawing that accompanies the detailed description can be briefly described as follows:

FIG. 1 is schematic showing a valve assembly with a self-adapting controller.

DETAILED DESCRIPTION

The teachings of the instant disclosure may be embodied in a self-adapting controller for HVAC appliances. The self-adapting controller uses a characteristic function f(h) of a valve. The controller can also determine a value h indicative of valve stroke from the inverse $f^{-1}$ of the characteristic function. The self-adapting controller may also rely on a measurement of flow through the valve. Determination of a gain parameter of the controller for a set-point value of flow $\varphi_{set}$ normally involves a ratio of $\varphi_{set}$ to actual flow $\varphi_{act}$. This determination will, however, yield a division by zero and fail in the event of zero actual flow $\varphi_{act}=0$. That is why a pre-determined value of nominal flow $\varphi_{nom}$ replaces actual flow $\varphi_{act}$ in the event of $\varphi_{act}=0$.

Some embodiments may include a self-adapting controller for HVAC appliances wherein a valve of a heat exchanger is communicatively connected to a HVAC controller and wherein the controller is fitted to and/or affixed to a HVAC controller. The HVAC controller may, in particular, be a cloud computer installed in a location remote from the remainder of the HVAC installation. Some embodiments may include a self-adapting controller for HVAC appliances wherein the controller employs pulse-width modulation to set the stroke of a valve. Some embodiments may include a self-adapting controller for HVAC appliances wherein the controller employs a voice coil and/or a solenoid actuator to adjust valve travel.

Some embodiments may include a self-adapting controller for HVAC appliances wherein the controller reads a signal indicative of flow from a sensor and wherein the flow sensor is arranged outside the fluid path. The flow sensor can, by way of non-limiting example, be selected from the group of electromagnetic flow sensor, ultrasonic flow sensor, and/or vortex flow sensor. Some embodiments may include a self-adapting controller for HVAC appliances wherein the controller processes the signal read from the flow sensor to produce a measure $\varphi_{act}$ of medium flow. Signal processing may, in particular, involve analog-to-digital conversion, oversampling, sigma-delta modulation, and/or input normalization.

Some embodiments may include a HVAC installation with a self-adapting controller according to the present disclosure. Some embodiments may include a valve for a heat exchanger with a self-adapting controller according to the present disclosure.

Some embodiments may include a valve assembly and/or a controller that enables control of quantities such as temperature and/or flow of energy. It is envisaged that such a valve assembly and/or such a controller relies on one measured quantity and/or on a plurality of measured quantities such as inlet temperature and/or outlet temperature and/or inlet pressure and/or outlet pressure.

FIG. 1 shows an example valve assembly 1 with a valve inlet 2 and with a valve outlet 3. A fluid path runs from the valve inlet 2 to the valve outlet 3. A valve element 4 is situated in the fluid path. FIG. 1 shows the valve element 4 in a (partially) open position such that flow of a medium between the inlet 2 and the outlet 3 is enabled. Valve element 4 may include a closed position to obturate flow along the fluid path. Valve element 4 may also have a fully open position in which flow between the valve inlet 2 and the valve outlet 3 is fully enabled.

In some embodiments, the position of valve element 4 can change continuously between its fully open and its fully closed position. In alternate embodiments, the position of valve element 4 can change in (a finite number of) discrete steps between fully open and fully closed.

An actuator 5 directly or indirectly couples to valve element 4 to set its position. Actuator 5 may, by way of non-limiting example, be chosen from the group of solenoid actuator, voice coil, hydraulic actuator and/or pneumatic actuator. FIG. 1 depicts an actuator 5 which axially displaces a valve element 4 as indicated by arrow 6. The instant disclosure also applies to valves and/or valve assemblies wherein actuator 5 pivotally changes the position of valve element 4 such as butterfly valves.

The assembly shown on FIG. 1 also comprises a flow sensor 7. Flow sensor 7 may be mounted outside the fluid path connecting inlet 2 to outlet 3. Flow sensor 7 can, by way of non-limiting example, be mounted to a (wall of a) conduit 8 enveloping the fluid path. Flow sensor 7 may be selected from the group comprising: electromagnetic flow sensor, ultrasonic flow sensor, and/or vortex flow sensor. In alternate embodiments, flow sensor 7 is a mass flow sensor and/or is installed inside the fluid path and/or inside conduit 8.

A mass flow sensor 7 enables measurements of large flow velocities especially in conjunction with HVAC appliances. Typical values of large flow velocities are 5 m/s, 10 m/s. At the same time, flow can be measured at velocities as low as 0.01 m/s. That is, a mass flow sensor 7 exhibits a wide dynamic range. Measurements of flow velocities are technically feasible between velocities of 0.1 m/s and 5 m/s, between velocities of 0.1 m/s and 10 m/s, between velocities of 0.1 m/s and 15 m/s, between velocities of 0.1 m/s and 20 m/s, or even between velocities of 0.1 m/s and 100 m/s. In an exemplary embodiment, mass flow sensor 7 is a type OMRON® D6F-W sensor or a type SENSOR TECHNICS® WBA sensor.

Sensor 7 and/or actuator 5 connect to a control unit 9. Sensor 7 and/or actuator 5 communicate with control unit 9 via suitable bus connections. The bus connections can be uni-directional and/or bi-directional. The bus connections can also be wireless bus connections. It is envisaged that sensor 7 and/or actuator 5 employ a suitable communication bus protocol, in particular a digital protocol, to communicate with control unit 9. Control unit 9, actuator 5 and sensor 7 then provide interfaces enabling (uni-directional or bi-directional) digital communication.

Control unit 9 may include a microprocessor with a memory and with a processing unit. In some embodiments, control unit 9 is a microprocessor with a memory and with a processing unit. In some embodiments, microprocessor 9 comprises an analog-to-digital converter for processing signals obtained from sensor 7. The analog-to-digital converter is thus an integral part of microprocessor 9. Microprocessors 9 with built-in analog-to-digital converters allow compact valve assemblies. In some embodiments, the analog-to-digital converter of microprocessor 9 functions to perform delta-sigma modulation. An analog-to-digital converter with delta-sigma modulation generally reduces noise of signals obtained from sensor 7. In some embodiments, control unit 9 is a cloud computer. That is, control unit 9 is installed at a location remote from conduit 8 and/or valve member 4 and/or actuator 5 and/or sensor 7.

Some embodiments may include a valve assembly for controlling a fluid flow to an appliance, the valve assembly comprising: a valve body having an inlet port (2) and an outlet port (3), with a fluid path extending between the inlet port (2) and the outlet port (3);

a valve member (4) situated in the fluid path between the inlet port (2) and the outlet port (3), the valve member (4) selectively displaceable between a closed position, which closes the fluid path between the inlet port (2) and the outlet port (3), and an open position, which opens the fluid path between the inlet port (2) and the outlet port (3); and a sensor(7) for sensing one or more parameters related to a fluid flow through the fluid path; and an actuator (5) (directly) coupled to the valve member (4); and a controller (9) for controlling the position of the valve member (4) via the actuator (5) in accordance with a set point value and with a default flow rate indicative of nominal flow through the fluid path, the controller (9) being communicatively (directly) coupled to the actuator (5) and to the sensor (7) and being configured to read one or more signals from the sensor (7), process the one or more signals to a measure of flow rate, compare the measure of flow rate to a predetermined threshold value indicative of zero flow rate or of substantially zero flow rate through the fluid path, and, if the measure of flow rate is less than or equal to the predetermined threshold value, determine or calculate a position of the valve member (4) directly from the set point value and the default flow rate, generate or produce a control signal from the determined or calculated position, send or communicate the control signal to the actuator (5).

In some embodiments, the valve assembly is a valve and/or a control valve. It is envisaged that the appliance is a heat exchanger and/or a fluid conveyor. In some embodiments, the controller (9) is a valve controller.

The position of the valve member (4) $h_{set}$ may be calculated as follows:

$$h_{set} = f^{-1}\left(\frac{\varphi_{set}}{\varphi_{nom}}\right),$$

wherein $\varphi_{set}$ denotes the set point value and $\varphi_{nom}$ denotes the default flow rate. Function f maps valve positions to values of flow. Function f is frequently referred to as an opening curve and/or a characterized curve. $f^{-1}$ denotes the inverse of function f. Function f and/or its inverse $f^{-1}$ may, by way of non-limiting example, be stored in a (non-volatile) memory of valve controller (9). Function f and/or its inverse $f^{-1}$ may, by way of a particular non-limiting example, be stored as a lookup table and/or as a mathematical relationship. In other words, the controller (9) may be configured to calculate a position of the valve member (4) directly from the set point value and the default flow rate using (the inverse of) an opening curve.

Direct determination or calculation from the set point value and the default flow rate means that no factors or arguments other than the set point value and the default flow rate are arguments of $f^{-1}$. Constant values that are specific to a particular valve may actually be provided by $f^{-1}$. In particular, no pressure drop $\Delta p$ over valve member (4) and/or over the fluid path enters as an argument.

The default flow rate indicative of nominal flow through the fluid path ideally is a maximum flow rate through the fluid path. That is, the default flow rate is the flow rate through the fluid path when the valve is at its fully open position and the pressure drop $\Delta p$ over the fluid path is rated pressure drop. The default flow rate $\varphi_{nom}$ can thus be expressed in terms of pressure drop $\Delta p$ and flow factor kvs as $$\varphi_{nom} = k_{VS} \cdot \sqrt{\Delta p}.$$

In some embodiments, substantially zero flow rate corresponds to (is associated with) a very low flow rate such as less than 0.1 m³/sec, less than 0.01 m³/sec or less than 0.001 m³/sec. According to an aspect, substantially zero flow rate corresponds to (is associated with) a flow rate that is less than or equal to minimum flow that can be measured by sensor (7). In some embodiments, substantially zero flow rate corresponds to (is associated with) a flow rate that is less than or equal to twice or five times minimum flow that can be measured by sensor (7).

In some embodiments, sensor (7) comprises a flow sensor. Flow sensor (7) can be selected from the group of electromagnetic flow sensor, ultrasonic flow sensor, mass flow sensor and/or vortex flow sensor. This list is not exhaustive. With flow sensor (7) being a mass flow sensor, the mass flow sensor may comprise an anemometer. The anemometer may, by way of example, comprise a sensor element that operates under constant temperature, under constant power, under constant voltage and/or under constant electric current.

The one or more parameters related to fluid flow include, but are not limited to, mass flow, volume flow, velocity or fluid flow, frequencies of vibrations induced by fluid flow, Doppler shifts of (ultrasonic) sound signals induced by fluid flow etc. In some embodiments, controller (9) reads one or more signals from sensor (7) using oversampling and/or delta-sigma modulation.

In some embodiments, controller (9) may be communicatively (directly) coupled to actuator (5) and to sensor (7) via a suitable bus. A suitable bus can, by way of non-limiting example, be a (serial field) bus according to ISO 11898-1: 2003 and/or a bus according to IEEE 802.3ax, in particular 802.3af:2003 and/or 802.3at:2009 and/or 802.3bt:2017. In some embodiments, the same bus connects to the controller (9), to the actuator (5), and to the sensor (7). In some embodiments, actuator (5) comprises an internal buffer such as a (rechargeable) battery. The internal buffer of actuator (5) enables actuator (5) to operate even if supply of power via the bus is insufficient.

In some embodiments, actuator (5) may be configured to (continuously or in discrete steps) set the position of valve member (4) in accordance with the signal communicated from controller (9). Actuator (5) may be configured to set the position of valve member (4) to an open position or to a closed position or (continuously or in discrete steps) to a position in between the open position or the closed position.

In some embodiments, there is a valve conduit (8) enveloping the fluid path between the inlet (2) and the outlet (3), wherein the sensor (7) comprises a flow sensor and is affixed to the valve conduit (8) and is arranged outside the fluid path.

In some embodiments, valve conduit (8) may comprise a lightweight material such as a polymeric material and/or an aluminum alloy. The use of a lightweight material yields benefits in terms of a lightweight valve assembly and/or a lightweight valve. Valve conduit (8) typically comprises apertures for inlet (2) and/or for outlet (3). Valve conduit (8) may comprise an aperture that allows insertion of valve member (4) into the fluid path. The latter aperture is advantageously sealed in order to inhibit leakages.

In some embodiments, valve member (4) may comprise ceramics, e.g. engineering ceramics, such as aluminum oxide ($Al_2O_3$) and/or silicon carbide (SiC) and/or zirconium dioxide ($ZrO_2$) and/or magnesium oxide (MgO). In some embodiments, valve member (4) comprises a ceramics material such as aluminum oxide with a suitable level of purity such as 92%, 96%, or 99%. Higher levels of purity confer advantages in terms of mechanical tightness, mechanical brittleness, and dielectric strength. In some embodiments, valve member (4) is coated with a suitable material such as a ceramics material. The coating may be selected from the above list of ceramics materials. The coating may also be made of a diamond-like carbon layer and/or of a diamond-like carbon material.

In some embodiments, valve member (4) is made of or is coated with a material with a modulus of elasticity of at least 100 GPa, at least 250 GPa, or at least 400 GPa.

Sensor (7) can, by way of non-limiting example, be affixed to and/or anchored to conduit (8) via a bolted and/or via a friction-locked and/or via a sleeve-type and/or via a dovetail joint. Sensor (7) can, by way of another non-limiting example, be glued to conduit (8).

In some embodiments, the controller (9) comprises a memory to be read by the controller (9), and also comprises a valve controller, wherein the memory stores at least one of the set point value, the predetermined threshold value, and/or the default flow rate indicative of nominal flow through the fluid path.

The memory may comprise a non-volatile memory. In some embodiments, the (non-volatile) memory stores at least two of the set point value, the predetermined threshold value, and/or the default flow rate indicative of nominal flow through the fluid path. In an embodiment, the (non-volatile) memory stores all of the set point value, the predetermined threshold value, and/or the default flow rate indicative of nominal flow through the fluid path. In some embodiments, controller (9) also reads the set point value, the predetermined threshold value, and/or the default flow rate indicative of nominal flow through the fluid path from its (non-volatile) memory. The predetermined threshold value and/or the default flow rate indicative of nominal flow are preferably written to and/or stored in the memory during manufacture and/or during factory acceptance testing and/or during commissioning. The set point value represents a flow rate. A user may enter or program the set point value into controller (9) via a suitable user interface. Also, an installation for heating, ventilation and/or air conditioning may be communicatively (directly) coupled to controller (9). The installation can thus communicate the set point value to controller (9).

In some embodiments, the controller (9) comprises an output interface with or compatible with or associated with a predetermined communication bus protocol and is communicatively (directly) coupled to the actuator (5) via the output interface and is configured to send or communicate the control signal to the actuator (5) via the output interface using the predetermined communication bus protocol of or associated with the output interface.

In some embodiments, the output interface comprises a protocol for or is compatible with ISO 11898-1:2003 and/or with IEEE 802.3ax, in particular with 802.3af:2003 and/or with 802.3at:2009 and/or with 802.3bt:2017. Output interface may comprise the predetermined communication bus protocol or be compatible with the predetermined communication bus protocol or be associated with the predetermined communication bus protocol. The predetermined communication bus protocol may be a digital protocol. In some embodiments, the output interface and/or the communication bus protocol enables encrypted communication between controller (9) and actuator (5). A Diffie-Hellman key exchange procedure with or without elliptic curves may be employed to encrypt communication between controller (9) and actuator (5).

In some embodiments, the output interface is a wireless output interface. The output interface comprises a predetermined communication bus protocol or is compatible with a predetermined communication bus protocol for wireless communication. In some embodiments, the output interface also functions to harvest energy from actuator (5) and/or from its connection to actuator (5). To that end, output interface can, by way of non-limiting example, rectify currents (electromagnetically) induced in actuator (5) or in the connections to actuator (5). In some embodiments, the valve assembly comprises an energy buffer such as a (rechargeable) battery and stores energy harvested via the output interface in its energy buffer.

In some embodiments, the controller (9) is configured to (directly) determine or calculate a ratio between the set point value and the default flow rate, and determine or calculate the position of the valve member (4) directly from the determined or calculated ratio. Direct determination or calculation from the set point value and the default flow rate means that no factors or arguments other than the set point value and the default flow rate enter as arguments. Constant values that are specific to a particular valve may actually be provided by f-1. In particular, the ratio is calculated irrespective of pressure drop Δp. Direct determination or calculation from the calculated or determined ratio means that no factors other arguments other than the calculated or determined ratio are arguments of f-1.

In some embodiments, the controller (9) comprises a microprocessor, wherein the microprocessor comprises an analog-to-digital converter as an integral component of the microprocessor, wherein the controller (9) is communicatively (directly) coupled to the sensor (7) via the analog-to-digital converter, and wherein the controller (9) is configured to process the one or more signals to a measure of flow rate using the analog-to-digital converter.

In some embodiments, an analog-to-digital converter allows compact valves and eliminates parts that are prone to failure. An onboard analog-to-digital converter also allows controller (9) to read one or more analog signals from sensor (7). Controller (9) may employ a technique such as over-sampling and/or delta-sigma modulation to reduce or eliminate noise from readings. Controller (9) may still further comprise a low-pass or a high-pass filter to reduce noise. It is envisaged that such a filter is self-adaptive. It is also envisaged that such a filter is an integral component of the microprocessor.

In some embodiments, the analog-to-digital converter is configured to carry out delta-sigma modulation and wherein the controller (9) is configured to process the one or more signals to a measure of flow rate using the analog-to-digital converter and using delta-sigma modulation.

In some embodiments, the controller (9) is configured to compare the measure of flow rate to a predetermined threshold value indicative of zero flow rate or of substantially zero flow rate through the fluid path, and, if the measure of flow rate is above the predetermined threshold value, determine or calculate a position of the valve member (4) from the set point value and from the measure of flow rate, generate or produce a control signal from the determined or calculated position, and send or communicate the control signal to the actuator (5).

In some embodiments, the position of the valve member (4) $h_{set}$ may be calculated as follows:

$$h_{set} = f^{-1}\left(\frac{\varphi_{set}}{\varphi_{act}} \cdot f(h_{act})\right),$$

wherein $\varphi_{set}$ denotes the set point value, $\varphi_{act}$ denotes the (actual) measure of flow rate and $h_{act}$ denotes the actual position of valve member (4). Function f maps valve positions to values of flow. Function f is frequently referred to as an opening curve and/or a characterized curve. $f^{-1}$ denotes the inverse of function f. Function f and/or its inverse $f^{-1}$ may, by way of non-limiting example, be stored in a (non-volatile) memory of valve controller (9). Function f and/or its inverse $f^{-1}$ may, by way of a particular non-limiting example, be stored as a lookup table and/or as a mathematical relationship. It is envisaged that controller (9) can calculate the inverse $f^{-1}$ from an opening curve f.

The actual position $h_{act}$ of valve member (4) may be obtained by measurement. In some embodiments, controller (9) assumes that the actual position $h_{act}$ has not changed since the last control operation. That is, $h_{act}$ is stored in a (non-volatile) memory of controller (9). Controller (9) reads $h_{act}$ from its (non-volatile) memory before it proceeds with the calculations as set forth above.

In some embodiments, actuator (5) may set the position of valve member (4) in accordance with the signal communicated from controller (9). Actuator (5) may (continuously or in discrete steps) set the position of valve member (4) to an open position or to a closed position or to a position in between the open position or the closed position.

In some embodiments, the controller (9) is configured to calculate a position of the valve member (4) directly from the set point value and the measure of flow rate and a previous (previously determined or calculated) position of the valve member (4), generate or produce a control signal from the determined or calculated position, and send or communicate the control signal to the actuator (5).

The previous (previously determined or calculated) position of the valve member (4) is $h_{act}$. That is, $h_{act}$ was previous (previously determined) and stored in (written to) a non-volatile memory of controller (9). Controller (9) reads $h_{act}$ from its (non-volatile) memory before it proceeds with the calculations as set forth above. Direct determination or calculation from the set point value and the measure of flow rate and a previous (previously determined or calculated) position of the valve member (4) means that no factors or arguments other than the set point value and the measure of flow rate and the previous (previously determined or calculated) position of the valve member (4) are arguments of $f^{-1}$. In particular, no pressure drop Op over valve member (4) and/or over the fluid path is entered as an argument.

In some embodiments, the controller (9) is configured to (directly) calculate a ratio between the set point value and the measure of flow rate, and calculate the position of the valve member (4) directly from the determined or calculated ratio and the previous (previously determined or calculated) position of the valve member (4). Direct determination or calculation from the determined or calculated ratio and the previous (previously determined or calculated) position of the valve member (4) means that no factors or arguments other than the determined or calculated ratio and the previous (previously determined or calculated) position of the valve member (4) are arguments of $f^{-1}$. In particular, no pressure drop Δp over valve member (4) and/or over the fluid path is entered as an argument.

In some embodiments, the controller (9) comprises a memory, in particular a non-volatile memory, storing the previous (previously determined or calculated) position of the valve member (4) and is configured to read the previous (previously determined or calculated) position of the valve member (4) from its memory, in particular from its non-volatile memory.

In some embodiments, the controller (9) comprises a memory for storing at least a determined or calculated position of the valve member (4) and is configured to write the determined or calculated position of the valve member (4) to the memory. Controller (9) can thus capitalize on the determined or calculated position of the valve member (4). Controller (9) can, for instance, use this value as a previous (previously determined) position $h_{act}$ of valve member (4) as the position of valve member (4) is determined or calculated anew.

In some embodiments, the controller (9) comprises a memory for storing at least a determined or calculated position of the valve member (4) and is configured to produce a control signal from the determined or calculated position using proportional and/or integral and/or derivative control (PID control). Controller (9) may, in particular, be configured to produce a control signal from the determined or calculated position using proportional and/or integral control (PI control). Controller (9) may also be configured to produce a control signal from the determined or calculated position using proportional control (P control). In order for controller (9) to effectuate control, it can ideally store a set of P control or PI control or PID control parameters in its (non-volatile) memory. Also, it can read a set of P control or PI control or PID control parameters from its (non-volatile) memory.

In some embodiments, the controller (9) is configured to produce of a control signal from the determined or calculated position using proportional and/or integral and/or derivative control (PID control). That is, the controller (9) is configured to determine and track at least an error value as a (direct) function of the determined or calculated position of the valve member (4) and of the previous (previously determined or calculated) position of the valve member (4) or of the measure of flow rate, weigh the at least an error value by a proportional parameter, integrate the at least an error value, calculate a derivative of the at least an error value, and produce a control signal as a function of the weighted at least an error value and also as a function of the integrated at least an error value and also as a function of the calculated derivative.

In some embodiments, the controller (9) comprises a memory, e.g. a non-volatile memory, storing a lookup table and is configured to read the lookup table from its memory, preferably from its non-volatile memory, and produce a control signal from the determined or calculated position using a lookup table. In some embodiments, the lookup table comprises a plurality of entries. Each entry comprises a position of the valve member (4) and a (an associated) control signal. In some embodiments, the controller (9) is configured to select an entry in the lookup table whose position of the valve member (4) matches or is closest to the determined or calculated position of the valve member (4), and produce a control signal that is the control signal of the selected entry.

In some embodiments, the controller (9) is configured to select the two entries in the lookup table whose positions of the valve member (4) match or are closest to the determined or calculated position of the valve member (4), and produce a control signal by (linear) interpolation between the two selected entries.

In some embodiments, the controller (9) comprises an input interface with a predetermined communication bus protocol or is compatible with a predetermined communication bus protocol or is associated with a predetermined communication bus protocol and is communicatively (directly) coupled to the sensor (7) via the input interface and is configured to read one or more signals from the sensor (7) via the input interface using the predetermined communication bus protocol of or associated with the input interface.

In some embodiments, the input interface may comprise a protocol for or is compatible with ISO 11898-1:2003 and/or with IEEE 802.3ax, in particular with 802.3af:2003 and/or with 802.3at:2009 and/or with 802.3bt:2017. Input interface may comprise the predetermined communication bus protocol or be compatible with the predetermined communication bus protocol or be associated with the predetermined communication bus protocol. The predetermined communication bus protocol preferably is a digital protocol. In an embodiment, the input interface and/or the communication bus protocol enables encrypted communication between controller (9) and sensor (7). A Diffie-Hellman key exchange procedure with or without elliptic curves may be employed to encrypt communication between controller (9) and sensor (7).

In some embodiments, the input interface is a wireless input interface. The input interface comprises a predetermined communication bus protocol or is compatible with a predetermined communication bus protocol for wireless communication or is associated with a predetermined communication bus protocol. In some embodiments, the input interface also functions to harvest energy from sensor (7) and/or from its connection to sensor (7). To that end, input interface can, by way of non-limiting example, rectify currents (electromagnetically) induced in sensor (7) or in connections to sensor (7). In some embodiments, the valve assembly comprises an energy buffer such as a (rechargeable) battery and stores energy harvested via the input interface in its energy buffer.

Parts of the valve assembly or parts of a method according to the present disclosure may be embodied in hardware, in a software module executed by a processor, or by a cloud computer, or by a combination thereof. The software may include a firmware, a hardware driver run in the operating system, or an application program. Thus, the disclosure also relates to a computer program product for performing the operations presented herein. If implemented in software, the functions described may be stored as one or more instructions on a computer-readable medium. Some examples of storage media that may be used include random access memory (RAM), magnetic RAM, read only memory (ROM), flash memory, EPROM memory, EEPROM memory, registers, a hard disk, a removable disk, other optical disks, a millipede® device, or any available media that can be accessed by a computer or any other IT equipment or appliance.

It should be understood that the foregoing relates only to certain embodiments of the disclosure and that numerous changes may be made therein without departing the scope of the disclosure as defined by the following claims. It should also be understood that the disclosure is not restricted to the illustrated embodiments and that various modifications can be made within the scope of the following claims.

REFERENCE NUMERALS 1 valve assembly
2 inlet
3 outlet
4 valve element
5 actuator
6 axis
7 sensor
8 conduit
9 control unit

The invention claimed is:

1. A valve assembly for controlling a fluid flow to an appliance, the valve assembly comprising:
 a valve body having an inlet port and an outlet port with a fluid path extending between the inlet port and the outlet port;
 a valve member in the fluid path, the valve member displaceable between a closed position blocking the fluid path and an open position;
 a sensor for sensing a parameter related to a fluid flow through the fluid path;
 an actuator coupled to the valve member; and
 a controller is configured to:

read a signal from the sensor;
process the signal to calculate a rate of fluid flow;
compare the rate of fluid flow to a predetermined threshold value associated with zero flow rate through the fluid path; and
if the rate of fluid flow is less than or equal to the predetermined threshold value, calculate a position of the valve member directly from a set point value and a default flow rate indicative of nominal flow through the fluid path using an inverse of an opening curve, produce a control signal from the calculated position, and communicate the control signal to the actuator, wherein the controller activates the actuator to control the position of the valve member based on the control signal.

2. The valve assembly according to claim 1, further comprising a valve conduit enveloping the fluid path;
wherein the sensor comprises a flow sensor affixed to the valve conduit and arranged outside the fluid path.

3. The valve assembly according to claim 1, wherein the controller comprises a memory storing at least one of the set point value, the predetermined threshold value, and the default flow rate indicative of nominal flow through the fluid path.

4. The valve assembly according to claim 1, wherein:
the controller comprises an output interface with a predetermined communication bus protocol and is communicatively coupled to the actuator via the output interface; and
the controller is configured to communicate the control signal to the actuator via the output interface using the predetermined communication bus protocol of the output interface.

5. The valve assembly according to claim 1, wherein:
the controller comprises a microprocessor including an analog-to-digital converter;
the controller is communicatively coupled to the sensor via the analog-to-digital converter; and
the controller is configured to calculate the rate of fluid flow using the analog-to-digital converter.

6. The valve assembly according to claim 5, wherein:
the analog-to-digital converter is configured to carry out delta-sigma modulation; and
the controller is configured to calculate the rate of fluid flow using the analog-to-digital converter.

7. The valve assembly according to claim 1, wherein if the rate of fluid flow is above the predetermined threshold value, the controller is configured to:
calculate a position of the valve member based at least in part on the set point value and the rate of fluid flow;
produce a control signal corresponding to the calculated position; and
communicate the control signal to the actuator, wherein the controller activates the actuator to control the position of the valve member based on the control signal.

8. The valve assembly according to claim 7, wherein if the rate of fluid flow is above the predetermined threshold value, the controller further calculates the position of the valve member directly from the set point value, the rate of fluid flow, and a previous position of the valve member.

9. The valve assembly according to claim 7, wherein if the rate of fluid flow is above the predetermined threshold value, the controller further calculates a ratio between the set point value and the rate of fluid flow; and
calculates the position of the valve member directly from the calculated ratio and a previous position of the valve member.

10. The valve assembly according to claim 8, wherein the controller comprises a memory storing the previous position of the valve member; and
the controller is configured to read the previous position of the valve member from the memory.

11. The valve assembly according to claim 1, wherein:
the controller comprises a memory storing the calculated position of the valve member; and
the controller is configured to write the calculated position of the valve member to the memory.

12. The valve assembly according to claim 1, wherein:
the controller comprises a memory storing the calculated position of the valve member; and
the controller is configured to produce the control signal from the calculated position using at least one of proportional, integral, or derivative control.

13. The valve assembly according to claim 1, wherein:
the controller comprises a memory storing a lookup table; and
the controller is configured to read the lookup table from the memory and produce the control signal from the calculated position using the lookup table.

14. The valve assembly according to claim 1, wherein:
the controller comprises an input interface with a predetermined communication bus protocol and is communicatively coupled to the sensor via the input interface; and
the controller is configured to read one or more signals from the sensor via the input interface using the predetermined communication bus protocol of the input interface.

15. A valve assembly for controlling a fluid flow to an appliance, the valve assembly comprising:
a valve body having an inlet port and an outlet port with a fluid path extending between the inlet port and the outlet port;
a valve member in the fluid path, the valve member displaceable between a closed position blocking the fluid path and an open position;
a sensor for sensing a parameter related to a fluid flow rate through the fluid path;
an actuator coupled to the valve member; and
a controller is configured to:
read a signal from the sensor;
process the signal to calculate the fluid flow rate;
compare the fluid flow rate to a predetermined threshold value associated with zero flow rate through the fluid path; and
if the fluid flow rate is less than or equal to the predetermined threshold value, calculate a position of the valve member directly by applying an inverse of an opening curve to a set point value divided by a default fluid flow rate indicative of nominal flow through the fluid path, wherein the opening curve maps valve positions to values of fluid flow rates,
produce a control signal from the calculated position, and
communicate the control signal to the actuator, wherein the controller activates the actuator to control the position of the valve member based on the control signal.

* * * * *